United States Patent

Song (10) Patent No.: US 9,395,417 B2
(45) Date of Patent: Jul. 19, 2016

(54) BATTERY PACK, APPARATUS INCLUDING BATTERY PACK, AND METHOD OF MANAGING BATTERY PACK

(71) Applicant: Samsung SDI Co., Ltd., Yongin-si, Gyeonggi-do (KR)

(72) Inventor: Hyun-Chul Song, Yongin-si (KR)

(73) Assignee: Samsung SDI Co., Ltd., Gyeonggi-do (KR)

( * ) Notice: Subject to any disclaimer, the term of this patent is extended or adjusted under 35 U.S.C. 154(b) by 205 days.

(21) Appl. No.: 14/199,800

(22) Filed: Mar. 6, 2014

(65) Prior Publication Data

US 2015/0048797 A1 Feb. 19, 2015

(30) Foreign Application Priority Data

Aug. 19, 2013 (KR) .................. 10-2013-0098140

(51) Int. Cl.
*H02J 7/00* (2006.01)
*G01R 31/36* (2006.01)

(52) U.S. Cl.
CPC ........ *G01R 31/3658* (2013.01); *G01R 31/3606* (2013.01); *H02J 7/0021* (2013.01); *H02J 7/0031* (2013.01); *Y02T 10/7055* (2013.01)

(58) Field of Classification Search
CPC ............ H02J 2007/0098; H02J 7/0004; H02J 7/0021; H02J 7/025; H02J 7/0047; H02J 7/0036
USPC .......................................... 320/134, 136, 167
See application file for complete search history.

(56) References Cited

U.S. PATENT DOCUMENTS

| 8,432,132 | B2 * | 4/2013 | Nakanishi | H02J 7/0016 320/116 |
| 2007/0033275 | A1 | 2/2007 | Toivonen et al. | |
| 2008/0290833 | A1 * | 11/2008 | Hayashi | H01M 10/4257 320/106 |
| 2011/0208953 | A1 * | 8/2011 | Solomon | G06F 1/14 713/2 |
| 2013/0234652 | A1 * | 9/2013 | Patel | G01K 13/00 320/107 |

FOREIGN PATENT DOCUMENTS

| KR | 92-12966 U | 7/1992 |
| KR | 1999-017075 A | 3/1999 |
| KR | 10-2005-0117541 A | 12/2005 |

* cited by examiner

*Primary Examiner* — Nghia Doan (74) *Attorney, Agent, or Firm* — Knobbe, Martens, Olson & Bear, LLP (57) ABSTRACT

A battery pack is disclosed. In one aspect, the battery pack includes a battery including at least one battery cell and a battery managing unit for controlling charging and discharging of the battery. The battery managing unit includes a measuring unit measuring at least one parameter of the battery per sampling period and generating measurement data. The battery managing unit also includes a control unit including a plurality of counters corresponding to a plurality of sections defined with respect to the parameter and configured to increment a counter corresponding to the section including the measurement data. The battery managing unit also includes a storage unit storing counter values of the counters in a predetermined address per logging period.

19 Claims, 8 Drawing Sheets

| COUNTER 241 | COUNTER VALUE (HEX) 242 | COUNTER VALUE (DEC) 243 | DETAILS 244 |
|---|---|---|---|
| counter #1 | 00 00 00 00 | 0 | 0.0V ≤ CELL VOLTAGE OF FIRST BATTERY CELL < 1.5V |
| counter #1 | 00 00 00 00 | 0 | 1.5V ≤ CELL VOLTAGE OF FIRST BATTERY CELL < 3.0V |
| counter #3 | 06 42 8C EA | 105024746 | 3.0V ≤ CELL VOLTAGE OF FIRST BATTERY CELL < 3.5V |
| counter #4 | 0F 33 2E EC | 255012588 | 3.5V ≤ CELL VOLTAGE OF FIRST BATTERY CELL < 3.8V |
| counter #5 | 07 4D 5B 67 | 122510183 | 3.8V ≤ CELL VOLTAGE OF FIRST BATTERY CELL < 4.0V |
| counter #6 | 00 92 FC B1 | 9632945 | 4.0V ≤ CELL VOLTAGE OF FIRST BATTERY CELL < 4.1V |
| counter #7 | 00 00 0F 02 | 3842 | 4.1V ≤ CELL VOLTAGE OF FIRST BATTERY CELL |
| counter #8 | 00 00 00 00 | 0 | 0.0V ≤ CELL VOLTAGE OF SECOND BATTERY CELL < 1.5V |
| counter #9 | 00 00 02 64 | 612 | 1.5V ≤ CELL VOLTAGE OF SECOND BATTERY CELL < 3.0V |
| counter #10 | 04 F3 7A 88 | 83065480 | 3.0V ≤ CELL VOLTAGE OF SECOND BATTERY CELL < 3.5V |
| counter #11 | 10 D0 F9 B0 | 282130864 | 3.5V ≤ CELL VOLTAGE OF SECOND BATTERY CELL < 3.8V |
| counter #12 | 06 8C 31 8F | 109851023 | 3.8V ≤ CELL VOLTAGE OF SECOND BATTERY CELL < 4.0V |
| counter #13 | 01 04 D5 57 | 17093975 | 4.0V ≤ CELL VOLTAGE OF SECOND BATTERY CELL < 4.1V |
| counter #14 | 00 00 A5 6E | 42350 | 4.1V ≤ CELL VOLTAGE OF SECOND BATTERY CELL |
| counter #257 | 00 00 00 00 | 0 | FIRST TEMPERATURE < -20°C |
| counter #258 | 01 06 71 97 | 17199511 | -20°C ≤ FIRST TEMPERATURE < 0°C |
| counter #259 | 11 69 EB 77 | 292154231 | 0°C ≤ FIRST TEMPERATURE < 20°C |
| counter #260 | 07 8B 98 4A | 126589002 | 20°C ≤ FIRST TEMPERATURE < 30°C |
| counter #261 | 03 5A 2D 98 | 56241560 | 30°C ≤ FIRST TEMPERATURE < 50°C |
| counter #262 | 00 00 00 00 | 0 | 50°C ≤ FIRST TEMPERATURE |
| counter #263 | 00 00 00 00 | 0 | SECOND TEMPERATURE < -20°C |
| counter #264 | 00 00 00 00 | 0 | -20°C ≤ SECOND TEMPERATURE < 0°C |
| counter #265 | 00 00 00 00 | 0 | 0°C ≤ SECOND TEMPERATURE < 20°C |
| counter #266 | 04 C1 06 F8 | 79759096 | 20°C ≤ SECOND TEMPERATURE < 30°C |
| counter #267 | 12 02 8C 00 | 302156800 | 30°C ≤ SECOND TEMPERATURE < 50°C |
| counter #268 | 06 92 8F F8 | 110268408 | 50°C ≤ SECOND TEMPERATURE |

FIG. 4B

| Addr(HEX) | Data(HEX) |
|---|---|
| 01 00 | 00 00 00 00 |
| 01 04 | 00 00 00 00 |
| 01 08 | 06 42 8C EA |
| 01 0C | 0F 33 2E EC |
| 01 10 | 07 4D 5B 67 |
| 01 14 | 00 92 FC B1 |
| 01 18 | 00 00 0F 02 |
| 01 1C | 00 00 00 00 |
| 01 20 | 00 00 02 64 |
| 01 24 | 04 F3 7A 88 |
| 01 28 | 10 D0 F9 B0 |
| 01 2C | 06 8C 31 8F |
| 01 30 | 01 04 D5 57 |
| 01 34 | 00 00 A5 6E |
| 05 00 | 00 00 00 00 |
| 05 04 | 01 06 71 97 |
| 05 08 | 11 69 EB 77 |
| 05 0C | 07 8B 98 4A |
| 05 10 | 03 5A 2D 98 |
| 05 14 | 00 00 00 00 |
| 05 18 | 00 00 00 00 |
| 05 1C | 00 00 00 00 |
| 05 20 | 00 00 00 00 |
| 05 24 | 04 C1 06 F8 |
| 05 28 | 12 02 8C 00 |
| 05 2C | 06 92 8F F8 |

251 — Addr(HEX); 252 — Data(HEX)

BATTERY PACK, APPARATUS INCLUDING BATTERY PACK, AND METHOD OF MANAGING BATTERY PACK

CROSS-REFERENCE TO RELATED APPLICATIONS

This application claims the benefit of Korean Patent Application No. 10-2013-0098140, filed on Aug. 19, 2013, in the Korean Intellectual Property Office, the disclosure of which is incorporated herein in its entirety by reference.

BACKGROUND

1. Field

The described technology generally relates to a battery pack, an apparatus including a battery pack, and a method of storing the history of a battery pack.

2. Description of the Related Technology

The number of different apparatuses including batteries are gradually increasing. For example, home appliances, such as electric drills and vacuums, use a battery to increase the portability of the appliance. Additionally, electric cars using batteries are becoming increasingly popular due to the price of oil. Energy storage systems using batteries are becoming more prominent as a backup power source not only in industry but also in households.

SUMMARY OF CERTAIN INVENTIVE ASPECTS

One inventive aspect is a method of managing a battery pack including a method of storing the history of a battery included in the battery pack, a battery pack employing the method, and an apparatus including the battery pack.

Another aspect is a battery pack including a memory, an apparatus including the battery pack, and a method of managing the battery pack, wherein the method includes storing the history of the battery pack in the memory.

Another aspect is a battery pack which includes: a battery including at least one battery cell and a battery managing unit controlling charging and discharging of the battery, wherein the battery managing unit includes a measuring unit measuring at least one parameter of the battery per sampling period and generating measurement data, a control unit including a plurality of counters corresponding to a plurality of sections defined with respect to the parameter and configured to increment a counter corresponding to the section including the measurement data, and a storage unit storing counter values of the counters in a predetermined address per logging period.

The battery may include at least one battery module including the battery cell and the battery managing unit may include at least one slave managing unit measuring the parameter of the battery module per sampling period and generating the measurement data, and a master managing unit connected to the slave managing unit and controlling the charging and discharging operations of the battery, wherein the master managing unit may include a microcontroller including the counters and configured to increment the counter corresponding to the section including the measurement data, and a non-volatile memory device storing the counter values of the counters in the predetermined address per logging period.

The parameter may include at least one of a cell voltage of the battery cell, the temperature of the battery, and a charging and discharging current of the battery.

The battery may include a plurality of battery modules each including the battery cells, wherein the parameter may include a cell voltage of each of the battery cells, and the temperature of each of the battery modules.

The sampling period may be within a range from about 0.1 second to about 1 second and the logging period may be within a range from about 0.1 hour to about 24 hours.

Each of the counter values may be stored in a space of 4 bytes of the storage unit.

The storage unit may be a non-volatile memory device including at least one of an electrically erasable programmable read-only memory (EEPROM), a flash memory, a ferroelectric random access memory (FeRAM), a magnetoresistive RAM (MRAM), or a phase-change memory (PRAM).

The control unit may be configured to control the charging and discharging of the battery based at least in part on the measurement data.

The control unit may be configured to calculate a total usage time of the battery by multiplying the sum of all counter values of the parameter by the sampling period.

The control unit may be configured to predict a remaining life of the battery based at least in part on the counter values.

The control unit may be configured to calculate a predictive value of a remaining life of the battery by subtracting the sum of all products obtained by multiplying the counter values of the parameter by corresponding weighting values from a predetermined basic life value.

The control unit may be configured to recognize a defective battery cell in the battery based at least in part on the counter values.

Another aspect is an apparatus including a battery pack that includes a battery including at least one battery cell, and a battery managing unit controlling charging and discharging of the battery, wherein the battery managing unit includes a measuring unit measuring at least one parameter of the battery per sampling period and generating measurement data, a control unit including a plurality of counters corresponding to a plurality of sections defined with respect to the parameter and configured to increment a counter corresponding to the section including the measurement data, and a storage unit storing counter values of the counters in a predetermined address per logging period.

The apparatus may be an energy storage apparatus including a power converting apparatus connected between the battery pack and at least one of a power generating system, a load, and a grid, and the power converting apparatus may convert electric energy transferred between the battery pack and the at least one of the power generating system, the load, and the grid.

The apparatus may be an electric car including the battery pack and a motor driven by electric energy stored in the battery pack.

The apparatus may be an electric product including the battery pack and a load driven by the battery pack.

Another aspect is a method of managing a battery pack that includes a battery including at least one battery cell and a battery managing unit for controlling charging and discharging of the battery, the method includes generating measurement data by measuring at least one parameter of the battery per sampling period, incrementing a counter corresponding to a section defined with respect to the parameter including the measurement data per sampling period by using a microcontroller including the counters, and storing counter values of the counters in predetermined addresses of a non-volatile memory device per logging period, by using the microcontroller.

The method may further include, when the battery managing unit is turned on, loading the counter values stored in the predetermined addresses of the non-volatile memory device into the counters of the microcontroller.

The method may further include, when the measurement data is outside a predetermined normal range, generating a warning or stopping the charging and discharging of the battery.

The method may further include calculating a total usage time of the battery or a predictive value of a remaining life of the battery based at least in part on the counter values.

Another aspect is a battery pack, comprising: at least one battery module comprising at least one battery cell; at least one slave managing unit configured to measure a value of at least one parameter of the battery per sampling period; and a master managing unit connected to the slave managing unit and configured to control charging and discharging operations of the battery, wherein at least one of the slave or master managing unit stores a plurality of reference parameter values which are divided into a plurality of ranges, and wherein the master managing unit comprises: a microcontroller comprising a plurality of counters having values respectively corresponding to the ranges, wherein the microcontroller is configured to increment the value of a counter corresponding to the range that the measured parameter value belongs to; and a non-volatile memory storing the counter values in a predetermined address.

Another aspect is a battery pack, comprising: a battery comprising at least one battery cell; a first memory storing a plurality of reference parameter values which are divided into a plurality of ranges; a measuring unit configured to measure a value of at least one parameter of the battery per sampling period; a controller comprising a plurality of counters having values respectively corresponding to the ranges, wherein the controller is configured to increment the value of a counter corresponding to the range that the measured parameter value belongs to; and a second memory storing the values of the counters in a predetermined address, wherein the second memory is configured to update the counter values per logging period.

In the above battery pack, the parameter comprises at least one of a cell voltage of the battery cell, the temperature of the battery, or a charging and discharging current of the battery. In the above battery pack, the controller is further configured to predict the remaining life of the battery based at least in part on the counter values.

BRIEF DESCRIPTION OF THE DRAWINGS

These and/or other aspects will become apparent and more readily appreciated from the following description of the embodiments, taken in conjunction with the accompanying drawings.

DETAILED DESCRIPTION OF CERTAIN INVENTIVE EMBODIMENTS

Typically, the lifetime of home appliances, electric cars, and energy storage systems is very long, e.g., about 10 years, compared to the lifetime of portable electronic devices, such as mobile phones and laptops. Accordingly, the life of batteries used in these devices has to be increased and the batteries should be suitably managed to facilitate the increase in lifetime. The history of various parameters of the battery can to be stored in a battery pack in order to suitably manage the battery, however, it is difficult to obtain sufficient storage capacity to store the entire history during the life of the battery. Moreover, even if the storage capacity is large enough, the increased cost of the storage may remarkably increase the cost of the battery pack.

Reference will now be made in detail to embodiments, examples of which are illustrated in the accompanying drawings. In this regard, the present embodiments may have different forms and should not be construed as being limited to the descriptions set forth herein. Accordingly, the embodiments are merely described below, by referring to the figures, to explain aspects of the described technology.

In the drawings, like reference numerals refer to like elements and the dimensions of elements may be exaggerated for clarity.

The terms used in the present specification are merely used to describe particular embodiments and are not intended to limit the described technology. An expression used in the singular form encompasses the expression of the plural form, unless the context clearly indicates otherwise. In the present specification, it is to be understood that the terms such as "including" or "having," etc., are intended to indicate the existence of the features disclosed in the specification and are not intended to preclude the possibility that one or more other features may exist or may be added. As used herein, the term "and/or" includes any and all combinations of one or more of the associated listed items. Expressions such as "at least one of," when preceding a list of elements, modify the entire list of elements and do not modify the individual elements of the list. While such terms as "first," "second," etc., may be used to describe various components, such components must not be limited to the above terms. The above terms are used only to distinguish one component from another. It will also be understood that when a component is referred to as being "on" another component, it can be directly on the other component, or intervening components may also be present.

Unless defined otherwise, technical and scientific terms used herein have the same meaning as is commonly understood by one of skill in the art to which the described technology belongs. Terms defined in general dictionaries are to be construed as having the contextual meanings of the related art and are not to be construed as having ideally or excessively formal meanings unless clearly defined herein.

Figure 1:
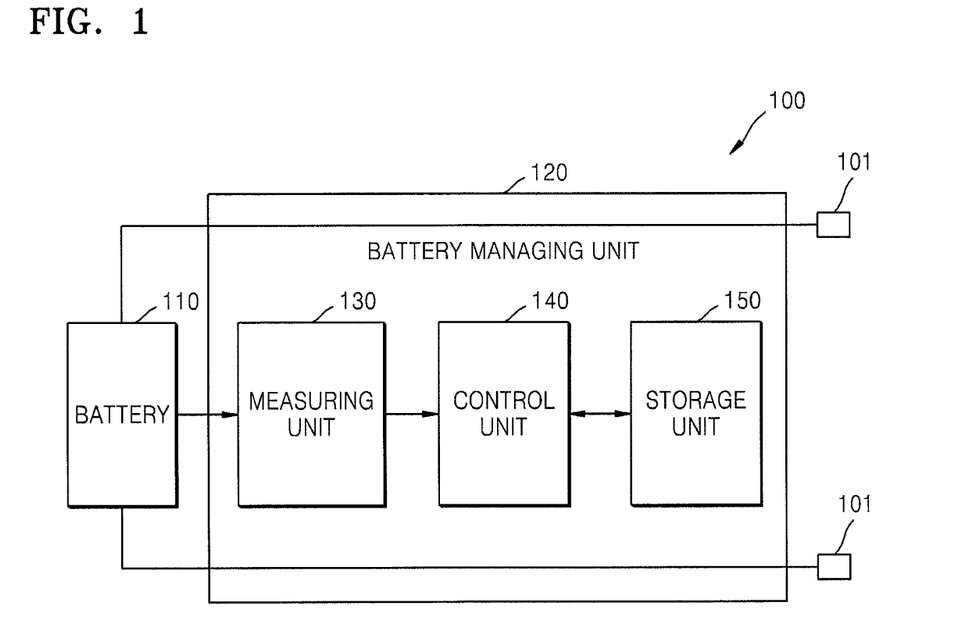
FIG. 1 is a block diagram of a battery pack according to an embodiment.

FIG. 1 a block diagram of a battery pack 100 according to an embodiment.

Referring to FIG. 1, the battery pack 100 includes a battery 110 and a battery managing unit 120. The battery managing unit 120 includes a measuring unit 130, a control unit (or a controller) 140, and a storage unit (or a memory) 150.

The battery 110 stores power and includes at least one battery cell. The battery 110 may include a plurality of battery cells that are connected in series, in parallel, or in a combination thereof. The number of battery cells included in the battery 110 may be determined according to the required output voltage. The battery 110 is connected to terminals 101, wherein the battery 110 outputs electric energy through the terminals 101 during discharging and stores electric energy received through the terminals 101 during charging.

The battery cell may include a chargeable secondary battery. For example, the battery cell may include a nickel-cadmium battery, a lead storage battery, a nickel metal hydride battery (NiMH), a lithium ion battery, or a lithium polymer battery.

The battery 110 may include a plurality of battery modules and the battery modules may include a plurality of battery cells connected in series, in parallel, or in a combination thereof.

The battery managing unit 120 monitors the state of the battery 110 and controls overall operations, such as charging and discharging, of the battery 110. The battery managing unit 120 may also be denoted as a battery management system (BMS).

The battery managing unit 120 may measure at least one parameter, such as a cell voltage, a temperature, a charging current, or a discharging current, of the battery 110, and may control the charging and discharging operations of the battery 110 based on the measured parameter. The battery managing unit 120 may calculate the remaining power amount, life, or state of charge (SOC) from the measured parameter, or determine whether the battery 110 is malfunctioning. For example, the battery managing unit 120 may recognize that a malfunction, such as overcharge, overdischarge, overcurrent, overvoltage, overheating, battery cell imbalancing, or battery cell deterioration, has occurred in the battery 110. When there is a malfunction, the battery managing unit 120 may perform operations based on an internal algorithm. For example, the battery managing unit 120 may control a charging switch and/or a discharging switch, or cut off a fuse. The battery managing unit 120 may control a cell balancing operation of the battery cells of the battery 110 according to the measured parameter and pre-determined algorithms.

The measuring unit 130 measures the at least one parameter of the battery 110 per sampling period to generate measurement data. The sampling period is a time interval for measuring the parameter and may be pre-set if required. When a variation in the value of the parameter is high, the sampling period may be short. On the other hand, when the variation in the value of the parameter is small or is relatively unimportant, the sampling period may be long. The sampling period may be set within a range of, for example, about 0.1 second to about 1 second. For example, the sampling period may be set to about 0.25 seconds.

The parameter may be a cell voltage of each battery cell in the battery 110. The measuring unit 130 may include a cell voltage measuring unit for measuring the cell voltage. The cell voltage measuring unit may be connected to nodes between the terminals 101 and the battery cells via wires.

The parameter may be the temperature of the battery 110. The measuring unit 130 may include a temperature measuring unit for measuring the temperature. The temperature measuring unit may include a temperature sensor. A plurality of the temperature sensors may be provided in the battery 110. When the battery 110 includes a plurality of battery cells or battery modules, a temperature sensor may be provided in each of the battery cells or battery modules. Alternatively, the temperature sensors may be provided in each of the battery modules.

The parameter may be charging and discharging currents of the battery 110. The measuring unit 130 may include a current measuring unit for measuring the charging and discharging currents. The current measuring unit may include a current sensor. The current sensor may be disposed between the battery 110 and the terminals 101.

The parameter may include two or more parameters selected from the cell voltage, the temperature, and the charging and discharging currents. For example, the parameter may include the cell voltage and the temperature. For example, the parameter may include the cell voltage, the temperature, and the charging and discharging currents. The parameter is not limited to above examples, and may include another parameter whose history needs to be stored. For example, the parameter may include a terminal voltage, a number of charging and discharging cycles, a charging time, a discharging time, a non-discharging time, or an operation time.

The measuring unit 130 may include an analog-digital converter for converting an analog value generated by measuring the at least one parameter to a digital value. The measuring unit 130 measures the parameter per sampling period and generates a digital value corresponding to the measured analog value of the parameter, as the measurement data.

The control unit 140 can include a plurality of counters. A plurality of sections (or ranges) are defined with respect to the parameter. In some embodiments, previously stored reference parameter values are divided into the ranges. For example, when the parameter is temperature, a range of measurable temperatures may be divided into a plurality of sections. For example, the sections may include a first section for temperatures lower than about −20° C., a second section for temperatures between about −20° C. to about 0° C., a third section for temperatures between about 0° C. to about 20° C., a fourth section for temperatures between about 20° C. to about 30° C., a fifth section for temperatures between about 30° C. to about 50° C., and a sixth section for temperatures higher than about 50° C. When the parameter is a cell voltage, the sections may include seven sections including the ranges defined by the values 1.5 V, 3 V, 3.5 V, 3.8 V, 4.0 V, and 4.1 V. The sections may be variously designed.

The counters respectively correspond to the sections. For example, when the parameter includes one hundred parameters in total, and ten sections are defined for each parameter, the total number of counters is one thousand.

The control unit 140 may receive the measurement data generated by the measuring unit 130. The control unit 140 is configured to determine which section the measurement data is included in, and increment a counter corresponding to the section including the measurement data. For example, when the parameter is temperature and the measurement data is about 15° C., the control unit 140 may increment a counter corresponding to the third section in the above example. When the measurement data measured in a following sampling period is about 21° C., the control unit 140 may increment a counter corresponding to the fourth section. For example, when one hundred data measurements are in the third section over 100 sampling periods, the value of the counter corresponding to the third section may be incremented by one hundred.

The control unit 140 may include a microcontroller. The counters may be realized as software in the microcontroller and the counter values may be stored in a temporary storage space in the microcontroller. The temporary storage space may be a register, a static random access memory (SRAM), or a dynamic random access memory (DRAM) in the microcontroller.

The storage unit 150 stores the counter values respectively corresponding to the sections in a predetermined address per logging period. The storage unit 150 is connected to the control unit 140 and may include at least one non-volatile memory device such as an electrically erasable programmable read-only memory (EEPROM), a flash memory, a ferroelectric RAM (FeRAM), a magnetoresistive RAM (MRAM), or a phase-change memory (PRAM). The storage unit 150 may be an EEPROM connected to the control unit 140.

When the battery managing unit 120 is turned off, the counter values may be all erased. Thus, the control unit 140 may store the counter values stored in the control unit 140 in the predetermined address of the storage unit 150 per logging period. When the battery managing unit 120 is turned on, the control unit 140 reads the counter values stored in the storage unit 150 and increments the counter value corresponding to measurement data, with respect to the read counter values.

The logging period may be set within a range of about 0.1 hour to about 24 hours. The non-volatile memory device has a lifespan. For example, an EEPROM is known to be rewritable about one million times. When the control unit 140 stores the counter values in the EEPROM per sampling period, the EEPROM is only usable for about ten days even when the sampling period is set to about 1 second. The control unit 140 may store the history of the parameter in the counter values loaded in the temporary storage space in the control unit 140 and store the counter values in the storage unit 150 per logging period. The logging period may be determined based on the lifetime of the storage unit 150 and based on the application of the battery pack 100. For example, when the logging period is about two hours, the EEPROM may be used for about 228 years.

Each of the counter values may be stored in a space of 4 bytes of the storage unit 150. A counter value in a range of 0 to 4,294,967,295 may be stored in the space of 4 bytes. When the sampling period is about 0.25 seconds, after about 10 years, the counter value will reach about 1,261,440,000. Accordingly, the counter value can be incremented for about 34 years in the storage space of 4 bytes. Even when the sampling period is about 0.1 second, the counter value can be incremented for about 13.6 years in the storage space of 4 bytes.

Also, in connection with the above described example, when the history is stored for one hundred parameters, the storage unit 150 may only require less than 4 kilobytes of space even when ten sections are defined for each parameter.

The control unit 140 may be configured to control the charging and discharging operations of the battery 110 based on the measurement data. When the measurement data represents the charging and discharging voltages, the control unit 140 may stop the charging when the measurement data is higher than a predetermined upper charging limit, and stop the discharging when the measurement data is lower than a predetermined lower discharging limit. The predetermined upper charging limit and the predetermined lower discharging limit may be stored in the storage unit 150.

The control unit 140 may calculate the total usage time of the battery pack 100 based on the counter values stored in the temporary storage space of the control unit 140 or the counter values stored in the storage unit 150. The control unit 140 may calculate the total usage time of the battery pack 100 by calculating the sum of all of the counter values with respect to any one of the parameters, and multiplying the sum by the sampling period. For example, when the total counter value obtained by adding counter values with respect to the cell voltage of a first battery cell is 126,144,000 and the sampling period is about 0.25 seconds, the total usage time of the battery pack 100 is about 315,634,000 seconds, i.e., about 365 days. As such, the control unit 140 may calculate the total usage time of the battery pack 100 based on the counter values.

The control unit 140 may be configured to predict the remaining life of the battery pack 100 based on the counter values. In detail, the control unit 140 may be configured to calculate a predictive value of the remaining life of the battery 110 by subtracting the sum of all products obtained by multiplying the counter values of any one of the parameters by corresponding weighting values from a predetermined basic life value. The battery 110 may have a shorter or longer life than the designed life according to the usage environment.

For example, when the battery pack 100 is used in a high temperature environment, the life of the battery pack 100 is shorter than when it is used in a room temperature environment. For example, when the temperature is about 50° C., the life of the battery 110 may be reduced by about half, or even to about 1/10. The counter values stored in the storage unit 150 indicate the type of environment in which the battery pack 100 has been used. Accordingly, the remaining life of the battery 110 may be predicted based on the counter values. For example, when the cell voltage of the battery pack 100 is used at a high voltage, the life of the battery 110 may be reduced. Alternatively, when the number of charging and discharging cycles of the battery pack 100 is high, the life of the battery 110 may be reduced.

The basic life value may be predetermined. The basic life value is the expected life when the battery pack 100 is used under an optimum environment. For example, the basic life value may be about 15 years and the basic life value may be stored in the storage unit 150. As described above, the total usage time of the battery pack 100 may be calculated based on the counter values. When the total usage time is about five years, the remaining life may be predicted to be about ten years.

Since history information about the usage environment is stored in the storage unit 150, the remaining life may be further accurately predicted based on the history information. For example, the battery pack 100 may be used for about three years at a temperature from about 20° C. to about 30° C., for about one year at a temperature from about 30° C. to about 50° C., and for about one year at a temperature higher than about 50° C. In this example, the weighting value for a usage period at the temperature from about 20° C. to about 30° C. is one, the weighting value for a usage period at the temperature from about 30° C. to about 50° C. is two, and the weighting value for a usage period at temperatures higher than about 50° C. is five. In these cases, the remaining life may be calculated by subtracting the sum of the product of each of the usage periods and the corresponding weighting values from a basic life value. In the current example, the remaining life is calculated to be about five years. In this example, the weighting value being one means that the battery 110 is expected to have a life of about the basic life value when used at temperatures from about 20° C. to about 30° C. The weighting value being two means that the battery 110 is expected to have a life of about half of the basic life value when used at temperatures from about 30° C. to about 50° C. The weighting value being five means that the battery 110 is expected to have a life of about 1/5 of the basic life value when used at a temperature greater than about 50° C.

The control unit 140 may be configured to recognize a defective battery cell in the battery 110 based on the counter values stored in the storage unit 150. For example, when history information about the cell voltage is stored in the storage unit 150 and the history indicates that the cell voltage of a battery cell was lower than a predetermined value, the battery cell may be determined to be defective. The control unit 140 may only display whether a defect has been generated, and at this time, a user is unable to know which battery cell is defective. However, since the storage unit 150 stores the history information about the cell voltage, the defective battery cell is accurately specified and may be replaced by a new battery cell.

Figure 2:
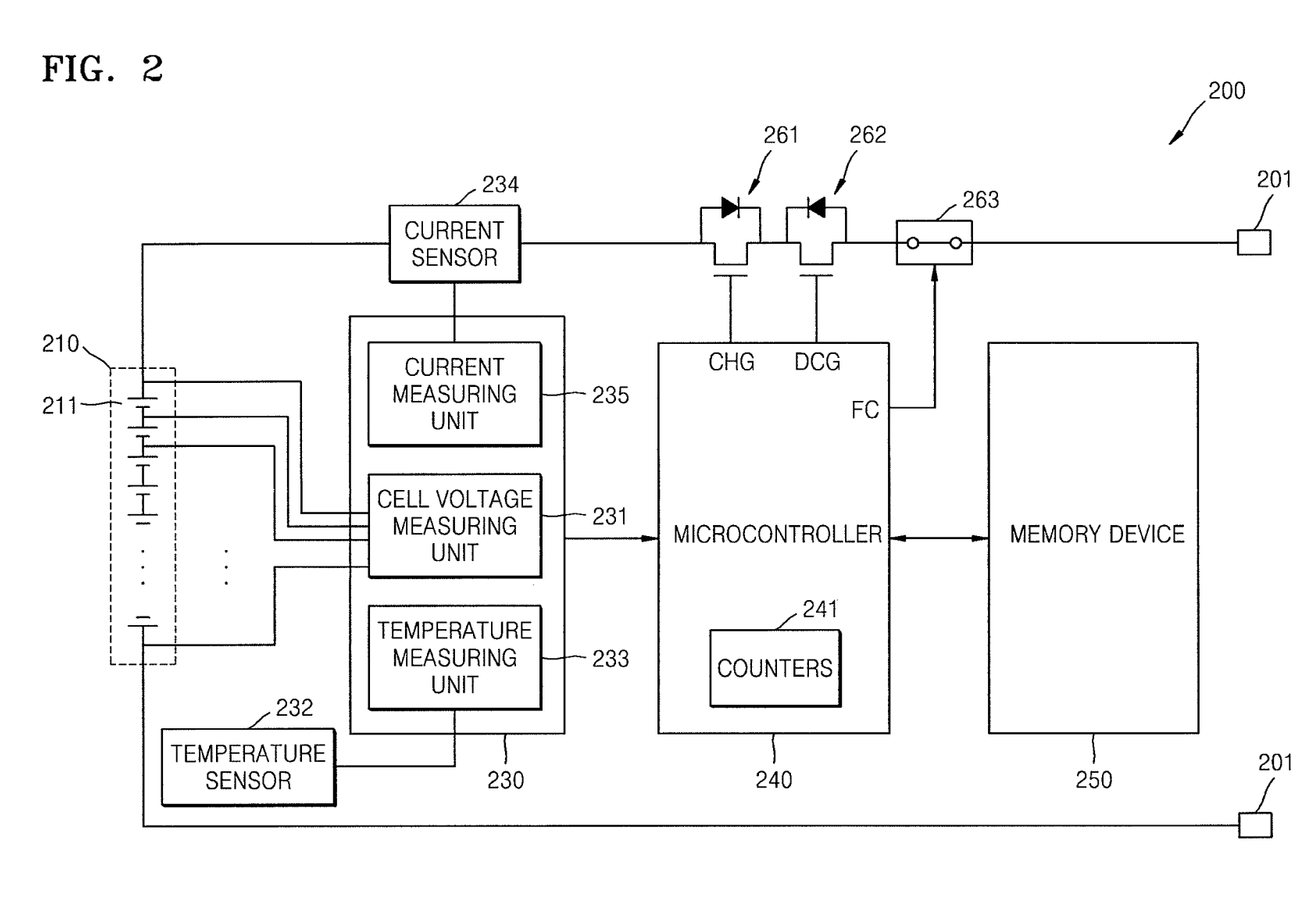
FIG. 2 is a block diagram of a battery pack according to another embodiment.

FIG. 2 is a block diagram of a battery pack 200 according to another embodiment.

Referring to FIG. 2, the battery pack 200 includes a battery 210, a measuring unit 230, a microcontroller 240, and a memory device 250.

The battery 210 includes a plurality of battery cells 211. In FIG. 2, the battery cells 211 are connected in series, but alternatively, the battery cell 211 may be connected in series, in parallel, or in a combination thereof. The number of battery cells 211 may be determined according to the required output voltage. The battery cells 211 are connected to terminals 201.

The measuring unit 230 measures at least one parameter of the battery 210 per sampling period to generate measurement data. The measuring unit 230 may be denoted as an analog front end (AFE). The sampling period may be set within a range from about 0.1 second to about 1 second. For example, the sampling period may be set to about 0.25 seconds. The parameter may include at least one of cell voltages of the battery cells 211, a temperature of the battery 210, or charging and discharging currents of the battery 210.

The measuring unit 230 includes a cell voltage measuring unit 231 for measuring the cell voltages. The cell voltage measuring unit 231 may be connected to wires extending from nodes between the terminals 201 and the battery cells 211. The cell voltage measuring unit 231 may measure a cell voltage and convert the measured cell voltage to cell voltage data by using an analog-digital converter. The cell voltage data may be provided to the microcontroller 240 as the measurement data.

The measuring unit 230 includes a temperature sensor 232 and a temperature measuring unit 233 for measuring the temperature of the battery 210. The temperature sensor 232 may be provided adjacent to the battery 210. The measuring unit 230 may include a plurality of the temperature sensors 232. The temperature sensor 232 may include a thermistor whose resistance changes according to temperature. The temperature measuring unit 233 may be connected to the temperature sensor 232 to convert an analog value corresponding to the measured temperature to temperature data. The temperature data may be provided to the microcontroller 240 as measurement data.

The measuring unit 230 includes a current sensor 234 and a current measuring unit 235 for measuring the charging and discharging currents. The current sensor 234 may be a shunt or a hall sensor provided on a high current path between the battery 210 and the terminals 101. The current measuring unit 235 may be connected to the current sensor 234 to convert an analog value corresponding to measured current to current data. The current data may be provided to the microcontroller 240 as measurement data.

In FIG. 2, the measuring unit 230 includes the cell voltage measuring unit 231, the temperature measuring unit 233, and the current measuring unit 235, but at least one of them may be omitted. Moreover, the measuring unit 230 may include another type of measuring unit to measure a different parameter.

The microcontroller 240 includes a plurality of counters 241. The counters 241 may be defined in the microcontroller 240 with software, such as firmware. The counter value of each of the counters 241 may be temporarily stored in a temporary storage space, such as a register, of the microcontroller 240. As described above, the plurality of sections are defined with respect to the parameter and the sections respectively correspond to the counters 241.

The microcontroller 240 is configured to receive the measurement data from the measuring unit 230, determine the section to which the measurement data belongs, and increment the counter 241 corresponding to the section including the measurement data.

The microcontroller 240 may monitor the state of the battery 210 and control overall operations, such as charging and discharging, of the battery 210. The microcontroller 240 may control the charging and discharging of the battery 210 based on the measurement data. The microcontroller 240 may calculate the remaining power amount, the life, or the SOC from the measurement data, or determine whether the battery 210 is malfunctioning. When the battery 210 is malfunctioning, the microcontroller 240 may control a charging switch 261 and/or a discharging switch 262, or cut off a fuse 263. When the measurement data reflects the voltage between the terminals 201, the microcontroller 240 may open the charging switch 261 to stop charging when the terminal voltage data is higher than an upper charging limit, and open the discharging switch 262 to stop discharging when the terminal voltage data is lower than a lower discharging limit, based on the upper charging limit and the lower discharging limit stored in the memory device 250. When the measurement data is current data, the microcontroller 240 may cut off the fuse 263 to protect the battery pack 200 when the current data is higher than an overcurrent reference value, based on the overcurrent reference value stored in the memory device 250.

The microcontroller 240 stores the counter values of the counters 241 in a predetermined address of the memory device 250 per logging period. The memory device 250 may be a non-volatile memory device, such as an EEPROM, a flash memory, a FeRAM, an MRAM, or a PRAM.

The logging period may be set in a range from about 0.1 hour to about 24 hours. The logging period may be set to, for example, about 2 hours. Each of the counter values may be stored in a space of 4 bytes of the memory device 250.

The microcontroller 240 may calculate the total usage time of the battery pack 200 based on the counter values of the counters 241 or the counter values stored in the memory device 250. Also, the microcontroller 240 may be configured to predict the remaining life of the battery pack 200 based on the counter values. In detail, the microcontroller 240 may be configured to calculate a predictive value of the remaining life of the battery 210 by subtracting the sum of all products obtained by multiplying the counter values of any one of the parameters by corresponding weighting values from a predetermined basic life value. The microcontroller 240 may be configured to recognize a defective battery cell in the battery 210 based on the counter values stored in the memory device 250.

Figure 3:
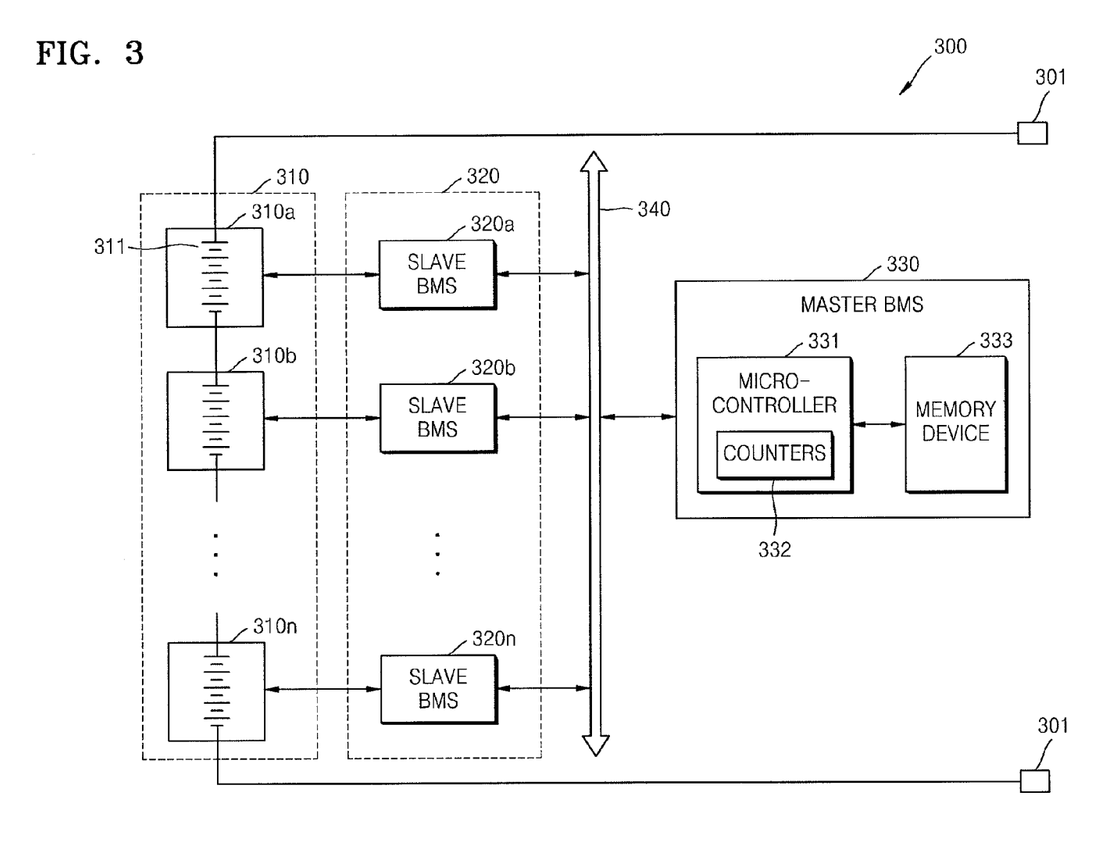
FIG. 3 is a block diagram of a battery pack according to another embodiment.

FIG. 3 is a block diagram of a battery pack 300 according to another embodiment.

Referring to FIG. 3, the battery pack 300 includes a battery 310, slave BMSs 320, and a master BMS 330. The battery pack 300 may be referred to as a battery rack, the slave BMS 320 may be referred to as a tray BMS or a slave managing unit, and the master BMS 330 may be referred to as a rack BMS or a master managing unit. The battery pack 330 may further include a bus line 340 for data communication between the slave BMSs 320 and the master BMS 330.

The battery 310 includes a plurality of battery modules 310a through 310n connectable in series, in parallel, or in a combination thereof. Each of the battery modules 310a through 310*n* includes a plurality of memory cells 311 connectable in series, in parallel, or in a combination thereof. Charging and discharging of the battery 310 may be controlled by the master BMS 330. The battery modules 310*a* through 310*n* may be monitored and controlled respectively by slave BMSs 320*a* through 320*n*.

The slave BMSs 320*a* through 320*n* may respectively control charging and discharging of the battery modules 310*a* through 310*n*. Also, the slave BMSs 320*a* through 320*n* may respectively measure at least one parameter of the battery modules 310*a* through 310*n* per sampling period to generate measurement data and transmit the measurement data to the master BMS 330. The sampling period may be set in a range from about 0.1 second to about 1 second. For example, the sampling period may be set to about 0.25 seconds. The parameter may include at least one of cell voltages of the battery cells 311, temperatures of the battery modules 310*a* through 310*n*, and charging and discharging currents of the battery 310.

For example, the slave BMSs 320*a* through 320*n* may respectively measure the cell voltages of the memory cells 311 included in the battery modules 310*a* through 310*n* and the temperatures of the battery modules 310*a* through 310*n*, and transmit the measured cell voltages and the measured temperatures to the master BMS 330, as measurement data.

The bus line 340 is a path for transferring data or commands between the master BMS 330 and the slave BMSs 320*a* through 320*n*. A communication protocol between the master BMS 330 and the slave BMSs 320*a* through 320*n* may be a controller area network (CAN) communication. However, the communication protocol is not limited thereto as long as data or commands are transferred using the bus line 340.

The master BMS 330 is communicably connected to the slave BMSs 320*a* through 320*n* through the bus line 340 and may control charging and discharging of the battery 310. The mater BMS 330 may include a microcontroller 331 and a memory device 333 connected to the microcontroller 331.

The microcontroller 331 includes a plurality of counters 332 defined in software, such as firmware. Counter values of the counters 332 may be temporarily stored in a register of the microcontroller 331. A plurality of sections may be defined with respect to the parameter and the counters 332 respectively correspond to the sections.

The microcontroller 331 is configured to receive the measurement data from the slave BMSs 320*a* through 320*n*, determine the section to which the measurement data belongs, and increment the counter 332 corresponding to the section including the measurement data. The microcontroller 331 may calculate the remaining power, the life, or the SOC, or determine whether the battery 310 is malfunctioning, based on the received measurement data.

The microcontroller 331 stores the counter values of the counters 332 in a predetermined address of the memory device 333 per logging period. The memory device 333 may be a non-volatile memory device, such as an EEPROM, a flash memory, a FeRAM, an MRAM, or a PRAM.

The logging period may be set in a range from about 0.1 hour to about 24 hours. The logging period may be set to, for example, about 2 hours. Each of the counter values may be stored in a space of 4 bytes of the memory device 333.

The microcontroller 331 may calculate a total usage time of the battery pack 300 based on the counter values. Also, the microcontroller 331 may be configured to predict the remaining life of the battery pack 300 based on the counter values. In detail, the microcontroller 331 may be configured to calculate a predictive value of the remaining life of the battery 310 by subtracting the sum of all products obtained by multiplying the counter values of any one of the parameters by corresponding weighting values from a predetermined basic life value. The microcontroller 331 may be configured to recognize a defective battery cell in the battery 310 based on the counter values stored in the memory device 333.

Figure 4A:
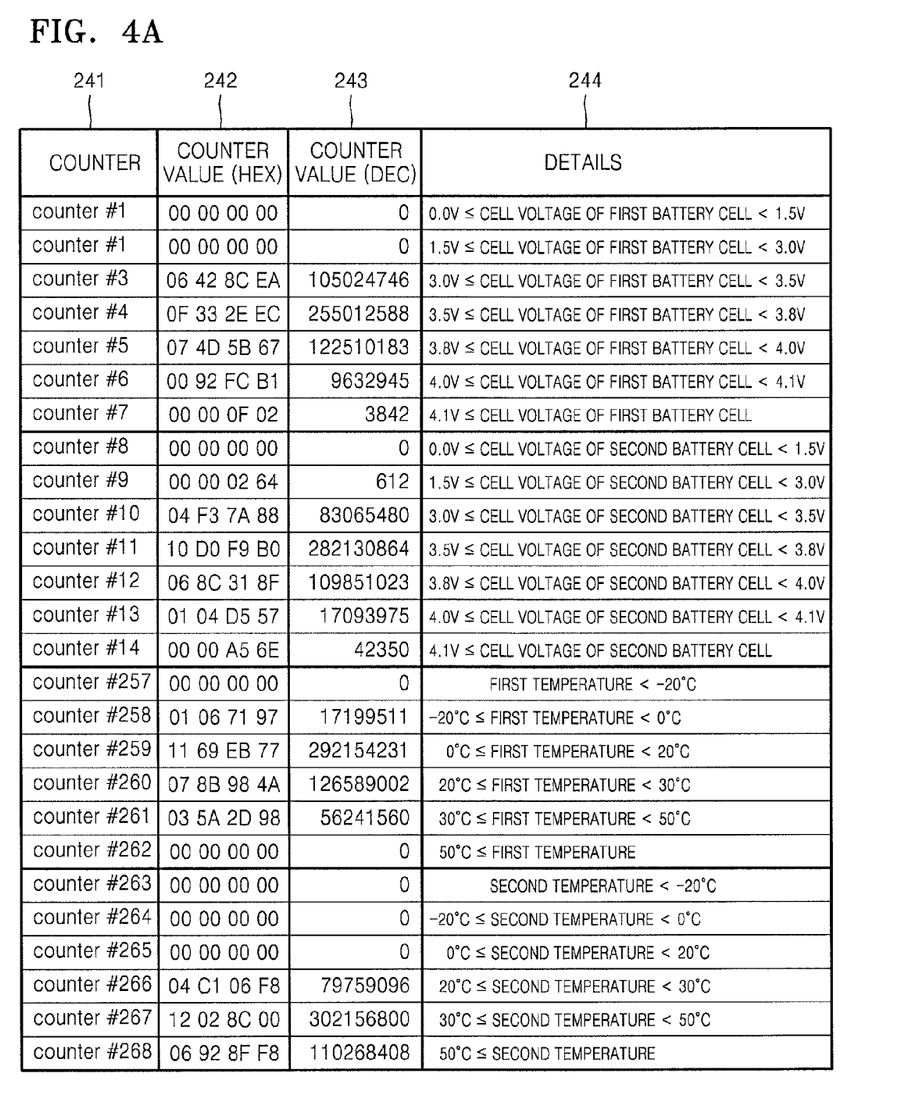
FIG. 4A is a table showing counters of a microcontroller of a battery pack, and counter values of the counters.

FIG. 4A is a table showing counters of a microcontroller of a battery pack, and the counter values of the counters, according to an embodiment.

Referring to FIGS. 2 and 4A, the microcontroller 240 includes a software module configured to perform the counting function. The counters 241 have counter values 242. The counter values 242 are the values stored in the microcontroller 240 expressed in hexadecimal. Only 4 bytes is required to store each of the counter values 242. Counter values 243 are the values of the counter values 242 expressed in decimal. The counter values 243 are not stored in the microcontroller 240. The counters 241 respectively correspond to a plurality of sections defined with respect to a parameter. Explanations of the sections referred to by the counters 241 are exemplarily shown in details 244.

In FIG. 4A, a method of storing histories of cell voltages and temperatures of a plurality of battery cells is illustrated. As shown in FIG. 4A, for example, counters #1 through #7 record data related to the cell voltage of a first battery cell and counters #8 through #14 record data related to the cell voltage of a second battery cell. Counters #257 through #262 record data related to a first temperature and counters #263 through #268 record data related to a second temperature. When the microcontroller 240 stores histories of the cell voltages of first through 256th battery cells and of first through 32nd temperatures, the microcontroller 240 may include 1984 counters. Here, counter values of the 1984 counters can be sufficiently stored in a space of about 8 kilobytes. The history of about ten years for about 288 different parameters may be stored in the space of about 8 kilobytes.

When the cell voltage of the first battery cell measured by the measuring unit 230 is within a range of about 0 V to about 1.5 V, the microcontroller 240 increases the counter value of the first counter. When the cell voltage of the first battery cell measured by the measuring unit 230 is within a range of about 1.5 V to about 3.0 V, the microcontroller 240 increases the counter value of the second counter. When the cell voltage of the first battery cell measured by the measuring unit 230 is within a range of about 3.0 V to about 3.5 V, the microcontroller 240 increases the counter value of the third counter. When the cell voltage of the first battery cell measured by the measuring unit 230 is within a range of about 3.5 V to about 3.8 V, the microcontroller 240 increases the counter value of the fourth counter. When the cell voltage of the first battery cell measured by the measuring unit 230 is within a range of about 3.8 V to about 4.0 V, the microcontroller 240 increases the counter value of the fifth counter. When the cell voltage of the first battery cell measured by the measuring unit 230 is within a range of about 4.0 V to about 4.1 V, the microcontroller 240 increases the counter value of the sixth counter. When the cell voltage of the first battery cell measured by the measuring unit 230 is higher than about 4.1 V, the microcontroller 240 increases the counter value of the seventh counter.

With respect to the 8th through 14th counters, the microcontroller 240 increases the counter value of a corresponding counter based on which section includes the cell voltage of the second battery cell measured by the measuring unit 230, similar to the first through seventh counters.

When the first temperature measured by the measuring unit 230 is lower than about −20° C., the microcontroller 240 increases the counter value of the 257th counter. When the first temperature measured by the measuring unit 230 is within a range of about −20° C. to about 0° C., the microcontroller 240 increases the counter value of the 258th counter. When the first temperature measured by the measuring unit 230 is within a range of about 0° C. to about 20° C., the microcontroller 240 increases the counter value of the 259th counter. When the first temperature measured by the measuring unit 230 is within a range of about 20° C. to about 30° C., the microcontroller 240 increases the counter value of the 260th counter. When the first temperature measured by the measuring unit 230 is within a range of about 30° C. to about 50° C., the microcontroller 240 increases the counter value of the 261st counter. When the first temperature measured by the measuring unit 230 is higher than about 50° C., the microcontroller 240 increases the counter value of the 262nd counter.

With respect to the 263rd through 268th counters, the microcontroller 240 increases the counter value of a corresponding counter based on which section includes the second temperature measured by the measuring unit 230, similar to the 257th through 261st counters.

The counter values 242 shown in FIG. 4A are examples. In the current embodiment, the sampling period is set to about 0.25 seconds.

The counter value of the third counter is 105024746 in decimal, which indicates that the time period that the cell voltage of the first battery cell of the battery pack 200 was within the range of about 3.0V to about 3.5V was about 303.9 days. The counter value of the fourth counter is 255012588 in decimal, which indicates that the time period that the cell voltage of the first battery cell of the battery pack 200 was within the range of about 3.0V to about 3.5V was about 737.9 days. The counter value of the fifth counter is 122510183 in decimal, which indicates that the time period that the cell voltage of the first battery cell of the battery pack 200 was within the range of about 3.0V to about 3.5V was about 354.5 days. The counter value of the sixth counter is 9632945 in decimal, which indicates that the time period that the cell voltage of the first battery cell of the battery pack 200 was within the range of about 3.0V to about 3.5V was about 27.9 days. The counter value of the seventh counter is 3842 in decimal, which indicates that the time period that the cell voltage of the first battery cell of the battery pack 200 was within the range of about 3.0 V to about 3.5 V was about 16 minutes.

As such, the history of the cell voltage of the second battery cell, the history of the first temperature, and the history of the second temperature may be determined based on the table of FIG. 4A.

The microcontroller 240 may calculate the total usage time of using the battery pack 200 based on the counter values 242. In FIG. 4A, since the histories of the cell voltages of the first and second battery cells are stored for the same period of time, the sum of the counter values of the counters #1 through #7 is the same as the sum of the counter values of the counters #8 through #14. Also, this sum is the same as the sum of the counter values of the counters #257 through #262. The total usage time of the battery pack 200 may be calculated based on these sums. A value obtained by multiplying the sum and the sampling period corresponds to the total usage time of the battery pack 200. In the current example, the sum of the counter values of the counters #263 through #268 is 492184304. Thus, the total usage time of the battery pack 200 is about 123046076 seconds, i.e., about 3.9 years.

The microcontroller 240 may be configured to predict the remaining life of the battery pack 200 based on the counter values 242. The microcontroller 240 may predict the remaining life by subtracting the total usage time of the battery pack 200 from a basic life of the battery pack 200. If the basic life is about 15 years, in the current example, the remaining life may be about 11.1 years.

The usage environment of the battery pack 200 is known to affect the life of the battery pack 200. In detail, the temperature may largely affect the life of the battery pack 200. For example, a battery which is typically usable for about 20 years at room temperature may be used for about 2 years at a temperature higher than about 50° C. and for about 5 years at a temperature from about 30° C. to about 50° C. In other words, in terms of life, the remaining life is more accurately predicted when the usage period at a temperature higher than about 50° C. is weighted by 10 times the usage period at room temperature. Further, the usage period at a temperature from about 30° C. to about 50° C. is weighted by 4 times the usage period at room temperature. As such, a weighting value may be given according to the sections of the parameter, for example, temperature. In other words, a first weighting value w1 is given to the section where the temperature is lower than about −20° C., a second weighting value w2 is given to the section where the temperature is from about −20° C. to about 0° C., a third weighting value w3 is given to the section where the temperature is from about 0° C. to about 20° C., a fourth weighting value w4 is given to the section where the temperature is from about 20° C. to about 30° C., a fifth weighting value w5 is given to the section where the temperature is from about 30° C. to about 50° C., and a sixth weighting value w6 is given to the section where the temperature is higher than about 50° C.

The weighted age of the battery pack 200 in consideration of the usage environment may be calculated by adding all values obtained by multiplying the usage times in each section of temperature by the weighting values of the corresponding sections. Also, the remaining life of the battery pack 200 may be calculated by subtracting the weighted age from the basic life.

The cell voltage, charging and discharging currents, and number of charging and discharging cycles may affect the life of the battery pack 200 and the remaining life of the battery pack 200 may be predicted based on the histories thereof. Also, the remaining life may be more accurately predicted by applying weighting values to the histories thereof.

The microcontroller 331 may be configured to recognize a defective battery cell in the battery 310 based on the counter values stored in the memory device 333. Based on the counter values of the example illustrated in FIG. 4, it is determined that the cell voltage of the second battery cell was in the section from about 1.5V to about 3.0V for about 153 seconds. When the cell voltage of a battery, cell is lower than about 3.0 V, the battery cell may be recognized as a defective battery cell. However, the microcontroller 331 may be unable to determine which battery cell is defective based only on the cell voltages. According to the current embodiment, an operator is able to determine which battery cell is defective based on the counter values.

Figure 4B:
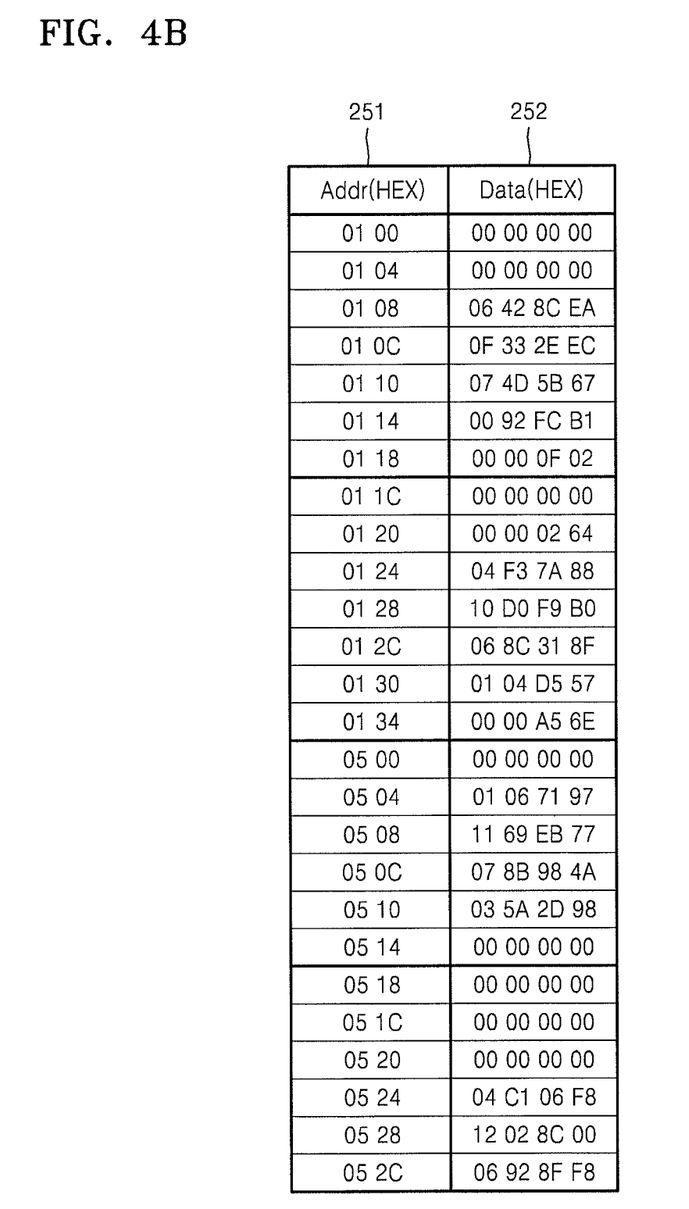
FIG. 4B is a table showing the counter values of FIG. 4 stored in a memory device.

FIG. 4B is a table showing the counter values of FIG. 4 stored in a memory device, according to an embodiment.

Referring to FIGS. 2 and 4B, the memory device 250 includes memory cells storing data. In order to write or read data to or from the memory cells, the memory cells are accessed through memory addresses. The memory device 250 may store the counter values 242 of FIG. 4A in predetermined addresses.

As described above, since the number of times the memory device 250 is rewritable is limited, the number of times the memory cells are accessed is adjusted so that the memory device 250 is usable for a long time, for example, more than about 10 years. According to an embodiment, the microcontroller 240 may store the counter values in the predetermined addresses of the memory device 250 per logging period set from about 0.1 hour to about 24 hours. The microcontroller 240 includes information about which address of the memory device 250 stores which counter value.

When the microcontroller 240 is turned off, the stored counter values may all be erased. When the microcontroller 240 is turned on, the counter values stored in the memory device 250 may be loaded into the counters 241.

Figure 5:
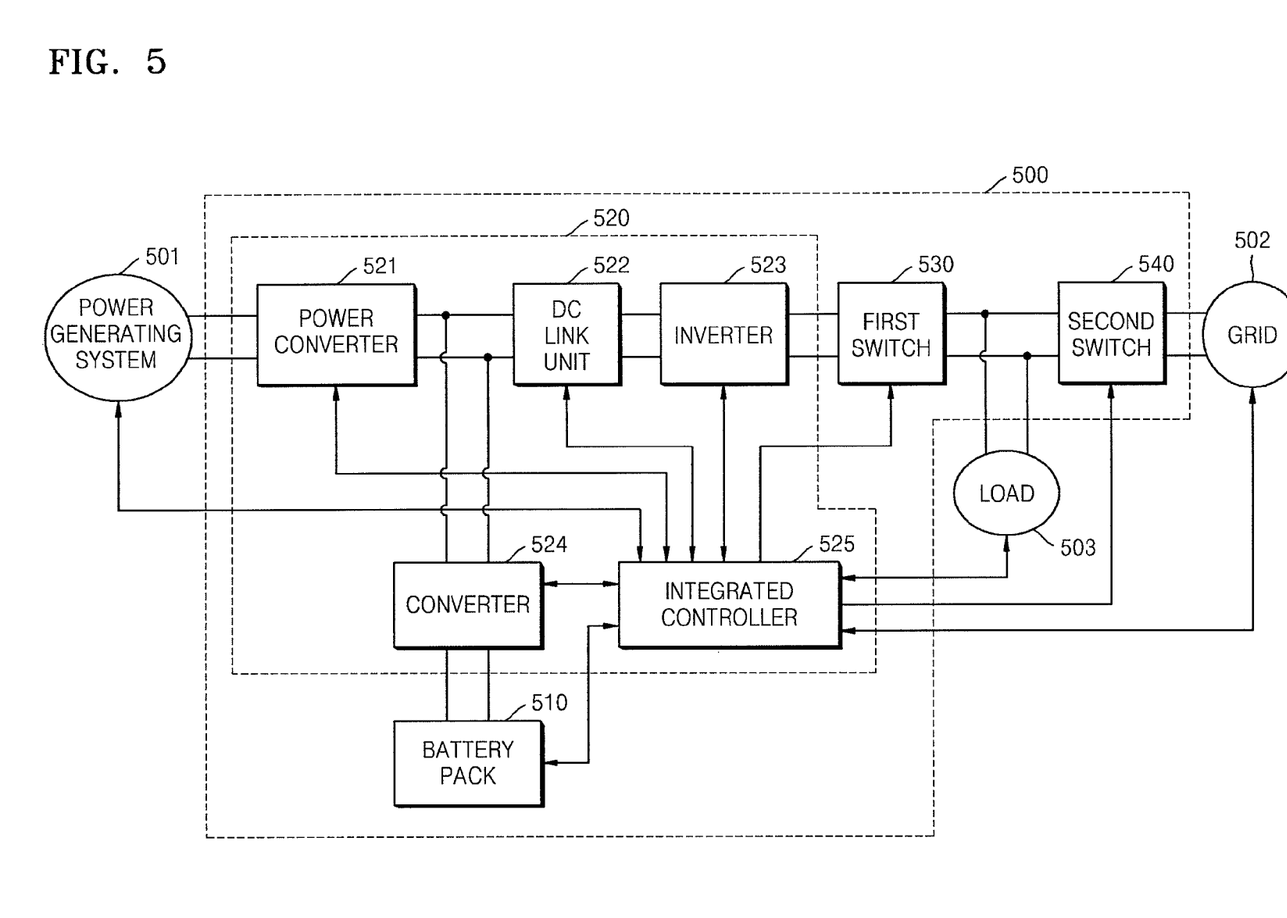
FIG. 5 is a block diagram of an energy storage apparatus including a battery pack, according to another embodiment.

FIG. 5 is a block diagram of an energy storage apparatus 500 including a battery pack 510 according to an embodiment.

Referring to FIG. 5, the energy storage apparatus 500 supplies power to a load 503 in connection with a power generating system 501 and a grid 502. The energy storage apparatus 500 may be referred to as an energy storage system.

The power generating system 501 is a system for generating power from an energy source. The power generating system 501 may supply the generated power to the energy storage apparatus 500. The power generating system 501 may include at least one of a solar power generating system, a wind power generating system, or a tidal power generating system. However, such systems are only examples and the described technology is not limited thereto. For example, any power generating system that generates power using new renewable energy, such as solar heat or terrestrial heat, may be included in the power generating system 501. In detail, since a solar cell that generates power using sunlight can be conveniently provided in homes or factories, the solar cell may be used together with the energy storage apparatus 500 in homes or factories. The power generating system 501 may form a high capacity energy system by arranging a plurality of power generating modules in parallel.

The grid 502 may include a power plant, a substation, and a power line. When the grid 502 is in a normal state, the grid 502 may provide power to the energy storage apparatus 500, i.e., to at least one of the load 503 and the battery pack 510, or the grid 502 may receive power from the energy storage apparatus 500, i.e., from the battery pack 510. When the grid 502 is in an abnormal state, power supply between the grid 502 and the energy storage apparatus 500 is stopped.

The load 503 may consume power generated by the power generating system 501, stored in the battery pack 510, or supplied from the grid 502. Electric devices in homes or factories are examples of the load 503.

The energy storage apparatus 500 may store power generated by the power generating system 501 in the battery pack 510 or supply the power generated by the power generating system 501 to the grid 502. The energy storage apparatus 500 may supply the power stored in the battery pack 510 to the grid 502 or store the power supplied from the grid 502 in the battery pack 510. Also, the energy storage apparatus 500 may supply the power generated by the power generating system 501 or the power stored in the battery pack 510 to the load 503. When the gird 502 is in an abnormal state, for example, when there is a blackout, the energy storage apparatus 500 functions as an uninterruptible power supply (UPS) so as to supply the power generated by the power generating system 501 or stored in the battery pack 510 to the load 503.

The energy storage apparatus 500 may include a power conversion system (PCS) 520, the battery pack 510, a first switch 530, and a second switch 540. The PCS 520 may be referred to as a power converting apparatus.

The PCS 520 may convert power provided from the power generating system 501, the grid 502, or the battery pack 510 to a suitable form, and supply the converted power to a required destination. The PCS 520 is connected between the battery pack 510 and at least one of the power generating system 501, the load 503, and the grid 502, and converts electric energy for transfer between the battery pack 510 and at least one of the power generating system 501, the load 503, and the grid 502. The PCS 520 may include a power converter 521, a direct current (DC) link unit 522, an inverter 523, a converter 524, and an integrated controller 525.

The power converter 521 may be a power converting apparatus connected between the power generating system 501 and the DC link unit 522. The power converter 521 may convert power generated by the power generating system 501 to a DC link voltage, and supply the DC link voltage to the DC link unit 522.

The power converter 521 may include a power converting circuit, such as a converter circuit or a rectifier circuit, according to the type of the power generating system 501. When the power generating system 501 generates DC power, the power converter 521 may include a DC-DC converter circuit to convert the DC power generated by the power generating system 501 to another DC power. When the power generating system 501 generates alternating current (AC) power, the power converter 521 may include a rectifier circuit to convert AC power to DC power.

When the power generating system 501 is a solar power generating system, the power converter 521 may include a maximum power point tracking (MPPT) converter for performing MPPT so as to obtain maximum power generated by the power generating system 501 according to changes in solar radiation and temperature. When there is no power generated by the power generating system 501, operations of the power converter 521 are stopped so as to reduce the power consumed by a power converting apparatus, such as a converter or a rectifier circuit.

The magnitude of the DC link voltage may be unstable due to an instantaneous voltage drop in the power generating system 501 or grid 502, or a peak load in the load 503. However, the DC link voltage needs to be stabilized for normal operations of the converter 524 and the inverter 523. The DC link unit 522 may be connected between the power converter 521 and the inverter 523 to uniformly maintain the DC link voltage. The DC link unit 522 may be a large storage capacitor.

The inverter 523 may be a power converting apparatus connected between the DC link unit 522 and the first switch 530. The inverter 523 may include an inverter for converting a DC link voltage output from at least one of the power generating system 501 and the battery pack 510 into the AC voltage of the grid 502 and outputting the AC voltage. Also, the inverter 523 may include a rectifier circuit for converting the AC voltage from the grid 502 to a DC voltage and outputting a DC link voltage in order to store power from the grid 502 in the battery pack 510 during a charging mode. The inverter 523 may be a bidirectional inverter whose input and output directions are changeable.

The inverter 523 may include a filter for removing harmonic waves from the AC voltage output to the grid 502. Also, the inverter 523 may include a phase locked loop (PLL) for synchronizing the phase of the AC voltage output from the inverter 523 and the phase of the AC voltage of the grid 502 so as to substantially suppress or limit the generation of reactive power. Also, the inverter 523 may perform functions to limit a voltage variation range, improve a power factor, remove a DC component, or protect or reduce a transient phenomenon.

The converter 524 may be a power converting apparatus connected between the DC link unit 522 and the battery pack

510. The converter 524 may include a DC-DC converter for performing DC-DC conversion on power stored in the battery pack 510 to a DC link voltage of a suitable voltage level and outputting the DC link voltage to the inverter 523 in a discharging mode. Also, the converter 524 may include a DC-DC converter for performing DC-DC conversion on the power output from the power converter 521 or the inverter 523 to a suitable voltage level, i.e., the charge voltage level required by the battery pack 510 and outputting the converted voltage to the battery pack 510 in a charging mode. The converter 524 may be a bidirectional converter whose input and output directions are changeable. When the battery pack 510 is not being charged or discharged, the operations of the converter 524 are stopped so as to reduce power consumption.

The integrated controller 525 may monitor the states of the power generating system 501, the grid 502, the battery pack 510, and the load 503. For example, the integrated controller 525 may monitor whether the grid 502 is blacked out, whether the power generating system 501 is generating power and when the power generating system 501 is generating power, the amount of power generated, the SOC of the battery pack 510, the power consumption of the load 503, and time.

The integrated controller 525 may control operations of the power converter 521, the inverter 523, the converter 524, the battery pack 510, the first switch 530, and the second switch 540 according to the monitoring results and a predetermined algorithm. For example, when the grid 502 is blacked out, the integrated controller 525 may control power stored in the battery pack 510 or generated by the power generating system 501 to be supplied to the load 503. Also, if sufficient power is not supplied to the load 503, the integrated controller 525 may determine the priority of electronic devices of the load 503, and control the load 503 such that power is supplied to electronic devices having a high priority. Also, the integrated controller 525 may control charging and discharging of the battery pack 510.

The first and second switches 530 and 540 are connected in series between the inverter 523 and the grid 502, and are turned on or off in accordance with control signals received from the integrated controller 525 so as to control the flow of current between the power generating system 501 and the grid 502. The first and second switches 530 and 540 are turned on or off according to the states of the power generating system 501, the grid 502, and the battery pack 510.

In detail, when power is supplied to the load 503 from at least one of the power generating system 501 and the battery pack 510, or to the battery pack 510 from the grid 502, the first switch 530 is turned on. When power is supplied to the grid 502 from at least one of the power generating system 501 and the battery pack 510 or to at least one of the load 503 and the battery pack 510 from the grid 502, the second switch 540 is turned on.

When the grid 502 is blacked out, the second switch 540 is turned off and the first switch 530 is turned on. In other words, while supplying power to the load 503 from at least one of the power generating system 501 and the battery pack 510, the power supplied to the load 503 is blocked from flowing towards the grid 502. As such, by operating the energy storage apparatus 500 as a stand-alone system, a worker operating on a power line of the grid 502 may be prevented from getting an electric shock due to power from the power generating system 501 or the battery pack 510.

The first and second switches 530 and 540 may include a switching apparatus, such as a relay, which is capable of transmitting or processing high current.

The battery pack 510 may receive and store power from at least one of the power generating system 501 and the grid 502 and supply the stored power to at least one of the load 503 and the grid 502. The battery pack 510 may include a power storage unit and a unit for controlling and protecting the power storage unit. Charging and discharging of the battery pack 510 may be controlled by the integrated controller 525. The battery pack 510 may correspond to any one of the battery packs 100 through 300 of FIGS. 1 through 3.

The battery pack 510 includes a battery including at least one battery cell and a battery managing unit for controlling charging and discharging of the battery. The battery managing unit includes a measuring unit for measuring at least one parameter of the battery to generate measurement data per sampling period, a control unit including a plurality of counters corresponding to a plurality of sections defined with respect to the parameter and configured to increment a counter corresponding to a section including the measurement data, and a storage unit for storing counter values of the counters in a predetermined address per logging period.

The control unit of the battery pack 510 may provide counter values stored in the storage unit to the integrated controller 525. The control unit of the battery pack 510 may calculate the remaining power, the battery life, or the SOC, or determine whether the battery is malfunctioning based on the measurement data. Also, the control unit of the battery pack 510 may provide information thereof to the integrated controller 525. The control unit may calculate various types of information based on the counter values. The various types of information may include the total usage time using the battery pack 510 and a predictive value of the remaining life of the battery pack 510. The control unit may provide the various types of information to the integrated controller 525.

Figure 6:
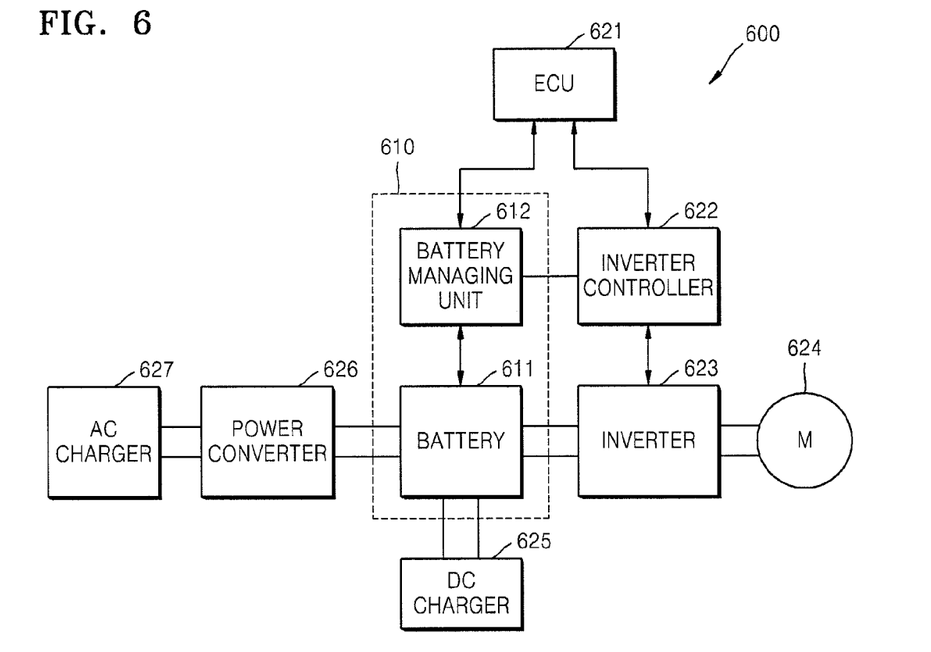
FIG. 6 is a block diagram of an electric car including a battery pack, according to an embodiment.

FIG. 6 is a block diagram of an electric car 600 including a battery pack 610 according to an embodiment.

Referring to FIG. 6, the electric car 600 may include an electronic control unit (ECU) 621, an inverter controller 622, an inverter 623, a motor 624, and the battery pack 610. The battery pack 610 includes a battery 611 including at least one battery cell and a battery managing unit 612 for controlling charging and discharging of the battery 611. The battery pack 610 may correspond to any one of the battery packs 100 through 300 of FIGS. 1 through 3.

The battery 611 may support output power of the motor 624 by supplying power to the motor 624 while the electric car 600 is driven and may recover and store regenerative braking energy of the motor 624 that operates as a generator during braking. The battery 611 may be charged using DC power supplied from a DC charger 625, such as a power conversion system or the energy storage system of a power charging station. The battery 611 may be charge using AC power supplied from an AC charger 627, such as a commercial power source. Accordingly, the electric car 600 may include a power converter 626, the battery 611 may be connected to the power converter 626, and the power converter 626 may convert AC power supplied from the AC charger 627 to DC power.

The battery managing unit 612 may detect information about the voltage, current, and temperature of the battery 611, and diagnose and manage the SOC of the battery 611. The battery managing unit 612 may provide information about the voltage, the current, the temperature, the SOC, and the diagnosis of the battery 611 to the ECU 621 through a communication line, for example, a CAN communication line of the electric car 600.

The battery managing unit 612 includes a measuring unit for measuring at least one parameter of the battery 611 to generate measurement data per sampling period, a control unit including a plurality of counters corresponding to a plurality of sections defined with respect to the parameter and configured to increment a counter corresponding to a section including the measurement data, and a storage unit for storing counter values of the counters in a predetermined address per logging period.

The control unit may provide the counter values stored in the storage unit to the ECU 621. Also, the control unit may calculate various types of information based on the counter values. The various types of information may include the total usage time of the battery pack 610 and a predictive value of the remaining life of the battery 611. The control unit may provide the information to the ECU 621.

The ECU 621 controls vehicle conditions and driving modes of the electric car 600 in general and enables stable driving by referring to the information about the battery 611 provided from the battery managing unit 612. The ECU 621 may control the inverter 623 through the inverter controller 622. The inverter 623 may convert DC power supplied from the battery 611 to AC power and supply the AC power to drive the motor 624. Also, the inverter 623 may convert AC power supplied from the motor 624 to DC power and supply the DC power to the battery 611 during braking.

The electric car 600 including the battery pack 610 is shown in FIG. 6. Alternatively, the battery pack 610 may be applied to any one of various transport devices which use electricity, such as a hybrid car, an electric bicycle, or an electric motorcycle.

Figure 7:
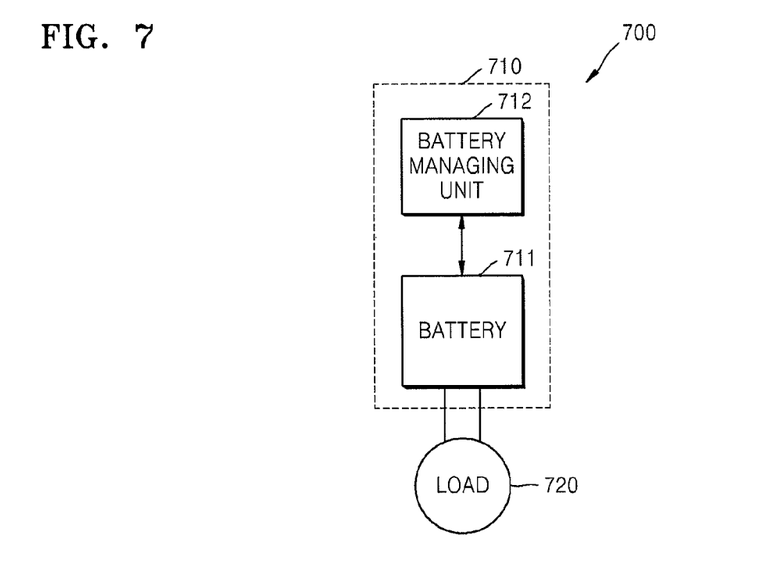
FIG. 7 is a block diagram of an electric product including a battery pack, according to yet another embodiment.

FIG. 7 is a block diagram of an electric product 700 including a battery pack 710 according to an embodiment.

Referring to FIG. 7, the electric product 700 may include the battery pack 710 and a load 720 driven by the battery pack 710. The battery pack 710 includes a battery 711 including at least one battery cell and a battery managing unit 712 for controlling charging and discharging of the battery 711. The battery pack 710 may correspond to any one of the battery packs 100 through 300 of FIG. 1 through 3.

The battery 711 may supply electric energy to the load 720 of the electric product 700 and be charged by using external power. The electric product 700 includes any apparatus or system including the battery pack 710. The electric product 700 may be a portable electronic device, such as a laptop, a mobile phone, or a smart phone including the battery pack 710. Alternatively, the electric product 700 may be a portable electric device, such as an electric drill, an electric toothbrush, a portable vacuum, a portable flashlight, a portable media player (PMP), or a portable speaker, including the battery pack 710.

The load 720 is an electric load driven to perform functions of the electric product 700, according to the type of the electric product 700.

The battery managing unit 712 includes a measuring unit for measuring at least one parameter of the battery 711 to generate measurement data per sampling period, a control unit including a plurality of counters corresponding to a plurality of sections defined with respect to the parameter and configured to increment a counter corresponding to a section including the measurement data, and a storage unit for storing counter values of the counters in a predetermined address per logging period.

The load 720 may further include an input and output unit for receiving an external input and outputting information. The input and output unit may be controlled by the battery managing unit 712 or communicably connected to the battery managing unit 712. The input and output unit may be a device required to perform intrinsic functions of the electric product 700.

The control unit may externally provide or display the counter values stored in the storage unit by using the input and output unit. Also, the control unit may calculate various types of information based on the counter values. The various types of information may include the total usage time of the battery pack 710 and a predictive value of the remaining life of the battery 711. The control unit may externally provide or display the various types of information by using the input and output unit.

Figure 8:
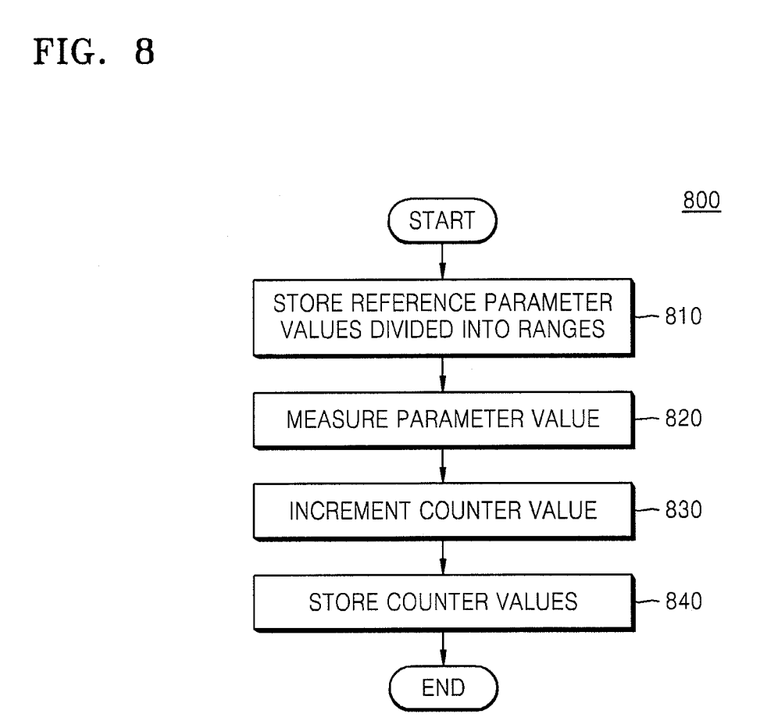
FIG. 8 is a flowchart showing an exemplary operation for managing a battery pack according to one embodiment.

FIG. 8 is a flowchart showing an exemplary operation or procedure 800 for managing a battery pack according to one embodiment. Depending on the embodiment, additional states may be added, others removed, or the order of the states changed in FIG. 8. In state 810, reference parameter values, which are divided into a plurality of ranges respectively corresponding to values of the counters, are stored. In state 820, a value of at least one parameter of the battery is measured per sampling period. In state 830, the value of a counter corresponding to the range that the measured parameter value belongs to is incremented. In state 840, the values of the counters are stored.

In some embodiments, the procedure 800 is implemented in a conventional programming language, such as C or C++ or another suitable programming language. In one embodiment, the program is stored on a computer accessible storage medium of the battery pack. In another embodiment, the program is stored in a separate storage medium. The storage medium may include any of a variety of technologies for storing information. In one embodiment, the storage medium includes a random access memory (RAM), hard disks, floppy disks, digital video devices, compact discs, video discs, and/or other optical storage mediums, etc. In another embodiment, the control unit 140 is configured to or programmed to perform at least part of the procedure 800. The program may be stored in the processor. In various embodiments, the processor may have a configuration based on, for example, i) an advanced RISC machine (ARM) microcontroller and ii) Intel Corporation's microprocessors (e.g., the Pentium family microprocessors). In one embodiment, the processor is implemented with a variety of computer platforms using a single chip or multichip microprocessors, digital signal processors, embedded microprocessors, microcontrollers, etc. In another embodiment, the processor is implemented with a wide range of operating systems such as Unix, Linux, Microsoft DOS, Microsoft Windows 7/Vista/2000/9x/ME/XP, Macintosh OS, OS/2, Android, iOS and the like. In another embodiment, at least part of the procedure 800 can be implemented with embedded software.

As described above, according to at least one embodiment, a battery pack may store the history of various characteristics of a battery for at least 10 years. The space of a memory storing the history may be reduced while storing a long history. Accordingly, the history of the battery pack may be stored without an additional cost. By storing the history, the battery pack may be further effectively managed.

While one or more embodiments of the described technology have been described with reference to the figures, it will be understood by those of ordinary skill in the art that various changes in form and details may be made therein without departing from the spirit and scope of the present invention as defined by the following claims.

What is claimed is:

1. A battery pack, comprising:
a battery comprising at least one battery cell; and
a battery managing unit configured to control charging and discharging operations of the battery, wherein the battery managing unit stores a history of at least one parameter of the battery, wherein a plurality of ranges are defined with respect to the parameter, and wherein the battery managing unit comprises:
- a measuring unit configured to periodically measure a value of the parameter, wherein the measured parameter value belongs to a range among the plurality of ranges;
- a controller comprising a plurality of counters respectively corresponding to the ranges, wherein the controller is configured to increment a value of a counter corresponding to the range, and wherein the incremented counter value indicates a total time period that the measured parameter values have been within the range; and
- a memory storing the counter values of the counters in a predetermined address, wherein the memory is configured to update the counter values per logging period.

2. The battery pack of claim 1, wherein the parameter comprises at least one of a cell voltage of the battery cell, the temperature of the battery, or a charging and discharging current of the battery.

3. The battery pack of claim 1, wherein each of the counter values is stored in a space of 4 bytes of the memory.

4. The battery pack of claim 1, wherein the controller is further configured to control the charging and discharging operations of the battery based at least in part on the measured parameter value.

5. The battery pack of claim 1, wherein the controller is further configured to calculate a total usage time of the battery by multiplying the sum of all counter values of the parameter by the number of a plurality of sampling periods during which the measuring unit periodically measures the values of the parameter.

6. The battery pack of claim 1, wherein the controller is further configured to predict the remaining life of the battery based at least in part on the counter values.

7. The battery pack of claim 1, wherein the controller is further configured to calculate a predictive value of the remaining life of the battery based on the difference between i) the sum of all products obtained by multiplying the counter values of the parameter and corresponding weighting values and ii) a predetermined basic life value.

8. The battery pack of claim 1, wherein the controller is further configured to recognize a defective battery cell based at least in part on the counter values.

9. The battery pack of claim 1,
wherein the battery comprises at least one battery module, and wherein the battery managing unit comprises:
- at least one slave managing unit configured to measure a value of at least one parameter of the battery module per sampling period; and
- a master managing unit connected to the slave managing unit and configured to control charging and discharging operations of the battery, wherein at least one of the slave or master managing unit stores a history of the parameter, and wherein the master managing unit comprises the controller and the memory.

10. An energy storage apparatus comprising:
a battery pack of claim 1; and
a power converting apparatus connected between the battery pack and at least one of a power generating system, a load, and a grid, and wherein the power converting apparatus is configured to convert electric energy transferred between the battery pack and the at least one of the power generating system, the load, and the grid.

11. An electric car comprising: a battery pack of claim 1 and a motor driven by electric energy stored in the battery pack.

12. An electric product comprising: a battery pack of claim 1 and a load driven by the battery pack.

13. A method of managing a battery pack including a battery and a plurality of counters, comprising:
- storing a history of at least one parameter of the battery, wherein the counters respectively correspond to a plurality of ranges which are defined with respect to the parameter;
- periodically measuring a value of the parameter, wherein the measured parameter value belongs to a range among the plurality of ranges;
- incrementing a value of a counter corresponding to the range, wherein the incremented counter value indicates a total time period that the measured parameter values have been within the range; and
- storing the values of the counters.

14. The method of claim 13, wherein the battery pack further includes a battery managing unit, the method further comprising loading the stored counter values into the counters when the battery managing unit is turned on.

15. The method of claim 13, further comprising generating a warning signal or stopping charging and discharging operations of the battery when the measurement data is outside a predetermined normal range.

16. The method of claim 13, further comprising calculating a total usage time of the battery or a predictive value of the remaining life of the battery based at least in part on the counter values.

17. A battery pack, comprising:
- a battery comprising at least one battery cell;
- a first memory storing a history of at least one parameter of the battery, wherein a plurality of ranges are defined with respect to the parameter;
- a measuring unit configured to periodically measure a value of the parameter, wherein the measured parameter value belongs to a range among the plurality of ranges;
- a controller comprising a plurality of counters respectively corresponding to the ranges, wherein the controller is configured to increment a value of a counter corresponding to the range, and wherein the incremented counter value indicates a total time period that the measured parameter values have been within the same range; and
- a second memory storing the values of the counters in a predetermined address, wherein the second memory is configured to update the counter values per logging period.

18. The battery pack of claim 17, wherein the parameter comprises at least one of a cell voltage of the battery cell, the temperature of the battery, or a charging and discharging current of the battery.

19. The battery pack of claim 17, wherein the controller is further configured to predict the remaining life of the battery based at least in part on the counter values.

* * * * *